United States Patent
Chiou et al.

(10) Patent No.: US 8,647,917 B2
(45) Date of Patent: Feb. 11, 2014

(54) METHOD OF MANUFACTURING SOLAR CELL

(75) Inventors: Yan-Kai Chiou, Jhunan Township, Miaoli County (TW); Ming-Chin Kuo, Jhunan Township, Miaoli County (TW); Ching-Tang Tsai, Jhunan Township, Miaoli County (TW); Tien-Szu Chen, Jhunan Township, Miaoli County (TW); Kuei-Wu Huang, Jhunan Township, Miaoli County (TW)

(73) Assignee: Gintech Energy Corporation, Miaoli County (TW)

( * ) Notice: Subject to any disclaimer, the term of this patent is extended or adjusted under 35 U.S.C. 154(b) by 145 days.

(21) Appl. No.: 13/191,788

(22) Filed: Jul. 27, 2011

(65) Prior Publication Data

US 2012/0220070 A1    Aug. 30, 2012

(30) Foreign Application Priority Data

Feb. 25, 2011    (TW) ............... 100106444 A (51) Int. Cl.
H01L 21/00    (2006.01)
(52) U.S. Cl.
USPC .............................. 438/98; 438/45
(58) Field of Classification Search
USPC ................. 438/57–98; 257/431–466
See application file for complete search history.

(56) References Cited

U.S. PATENT DOCUMENTS

| | | | | |
|---|---|---|---|---|
| 4,360,701 A * | 11/1982 | Evans, Jr. | ...... | 136/259 |
| 8,153,456 B2 * | 4/2012 | Gupta et al. | ...... | 438/22 |
| 2009/0017617 A1 * | 1/2009 | Rohatgi et al. | ...... | 438/660 |
| 2010/0197126 A1 * | 8/2010 | Bateman et al. | ...... | 438/527 |
| 2011/0139230 A1 * | 6/2011 | Rohatgi et al. | ...... | 136/255 |

* cited by examiner

*Primary Examiner* — Fernando L Toledo
*Assistant Examiner* — Karen Kusumakar
(74) *Attorney, Agent, or Firm* — Knobbe, Martens, Olson & Bear, LLP (57) ABSTRACT

A method of manufacturing a solar cell includes the following steps. An ion implantation process is performed to a first surface of a substrate to form a first doping layer. Then, the ion implantation process is performed to a second surface of the substrate to form a second doping layer. After that, an annealing process is performed to the structure formed by the substrate, the first doping layer and the second doping layer, and forming a first passivation layer on the first doping layer and a second passivation layer on the second doping layer by the annealing process. A third passivation layer is formed on the first passivation layer formed after the annealing process and a fourth passivation layer is formed on the second passivation layer formed after the annealing process. Afterward, conductive electrodes are formed on the third passivation layer and the fourth passivation layer, respectively.

8 Claims, 9 Drawing Sheets

METHOD OF MANUFACTURING SOLAR CELL

RELATED APPLICATIONS

This application claims priority to Taiwan Application Serial Number 100106444, filed Feb. 25, 2011, which is herein incorporated by reference.

BACKGROUND

1. Field of Invention

The present disclosure relates generally to a method of manufacturing a photoelectric device, and more particularly to a method of manufacturing a solar cell.

2. Description of Related Art

In a traditional method of manufacturing a solar cell, a diffusion process is adopted to dope dopants into a substrate to form a p-n junction. Electron-hole pairs are generated when the light is incident to the p-n junction and thus current is generated by the movement of the electron-hole pairs in the substrate so that photoelectric conversion is achieved. For example, when a p-type substrate is adopted for the solar cell, the p-type substrate is placed in a high temperature furnace tube; the diffusion process with n-type phosphorus is then performed to the p-type substrate to dope the n-type dopants into the p-type substrate in the diffusion process of the solar cell.

However, an unnecessary phosphosilicate glass layer is formed in the high temperature phosphorus diffusion process, and a layer covers the whole p-type substrate with n-type dopants after the high temperature phosphorus diffusion process. The n-type dopants may cause a short circuit between positive-electrodes and negative-electrodes of the solar cell. Then, a phosphosilicate glass etching process needs to be adopted to clean the phosphosilicate glass and a laser etching, a plasma etching or a chemical etching process also needs to be performed to the substrate of the solar cell for edge isolation to avoid the short circuit between the positive electrodes and the negative electrodes of the substrate.

Therefore, additional complex processes such as the phosphosilicate glass etching process and the edge isolation process have to be performed and are necessary after the diffusion process is performed to dope the dopants into the substrate during a traditional process of manufacturing the solar cell. Accordingly, the traditional method of manufacturing the solar cell has foregoing issues in the doping process, and thus, it becomes an important subject to improve and simplify the manufacturing process of the solar cell.

SUMMARY

The present disclosure is to provide a method of manufacturing a solar cell to solve the previous manufacturing issues of the solar cell.

One aspect of the present disclosure is to provide the method of manufacturing the solar cell, which includes the following steps. An ion implantation process is performed to a first surface of a substrate to form a first doping layer. Then, the ion implantation process is performed to a second surface of the substrate to form a second doping layer. After that, an annealing process is performed to the structure formed by the substrate, the first doping layer and the second doping layer, and forming a first passivation layer on the first doping layer and a second passivation layer on the second doping layer by the annealing process. A third passivation layer is formed on the first passivation layer formed after the annealing process and a fourth passivation layer is formed on the second passivation layer formed after the annealing process. Afterward, conductive electrodes are formed on the third passivation layer and the fourth passivation layer, respectively.

According to one embodiment of the present disclosure, the method of manufacturing the solar cell further includes a texture process performed to the first surface and the second surface of the substrate by an etching method before the ion implantation process.

According to another embodiment of the present disclosure, wherein the substrate is a p-type substrate, n-type dopants are implanted to the first surface by the ion implantation process, and $p^+$-type dopants are implanted to the second surface by the ion implantation process.

According to one another embodiment of the present disclosure, wherein the substrate is an n-type substrate, p-type dopants are implanted to the first surface by the ion implantation process, and $n^+$-type dopants are implanted to the second surface by the ion implantation process.

According to yet another embodiment of the present disclosure, wherein the third passivation layer and the fourth passivation layer are formed by a chemical vapor deposition process.

Another aspect of the present disclosure is to provide the method of manufacturing the solar cell, which includes the following steps. An ion implantation process is performed to a first surface of a substrate to form a first doping layer. Then, the ion implantation process is performed to a second surface of the substrate to form a second doping layer. After that, an annealing process is performed to the structure formed by the substrate, the first doping layer and the second doping layer, and forming a first passivation layer on the first doping layer and a second passivation layer on the second doping layer by the annealing process. A third passivation layer is formed on the first passivation layer formed after the annealing process. Afterward, conductive electrodes are formed on the third passivation layer and the second passivation layer formed after the annealing process, respectively.

According to one embodiment of the present disclosure, the method of manufacturing a solar cell further includes a texture process performed to the first surface of the substrate by an etching method before the ion implantation process.

According to another embodiment of the present disclosure, wherein the substrate is a p-type substrate, n-type dopants are implanted to the first surface by the ion implantation process, and $p^+$-type dopants are implanted to the second surface by the ion implantation process.

According to one another embodiment of the present disclosure, wherein the substrate is an n-type substrate, p-type dopants are implanted to the first surface by the ion implantation process, and $n^+$-type dopants are implanted to the second surface by the ion implantation process.

According to yet another embodiment of the present disclosure, wherein the third passivation layer is formed by a chemical vapor deposition process.

It is to be understood that both the foregoing general description and the following detailed description are by examples, and are intended to provide further explanation of the invention as claimed.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

FIGS. 1A-1I are structure diagrams of manufacturing process flow of a solar cell according to one embodiment of the present disclosure. FIG. 2 is a flow diagram of a method of manufacturing the solar cell according to one embodiment of the present disclosure. Please refer to FIGS. 1A-1I and FIG. 2 at the same time.

Figure 1A:
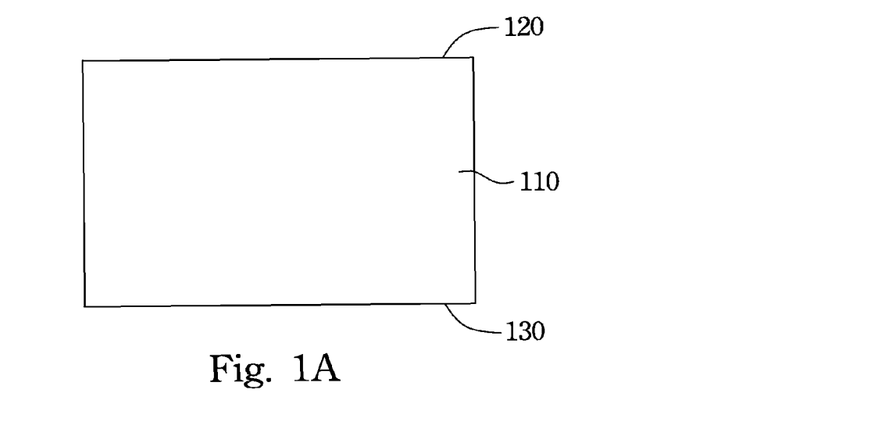
FIGS. 1A-1I are structure diagrams of manufacturing process flow of a solar cell according to one embodiment of the present disclosure.
Figure 1B:
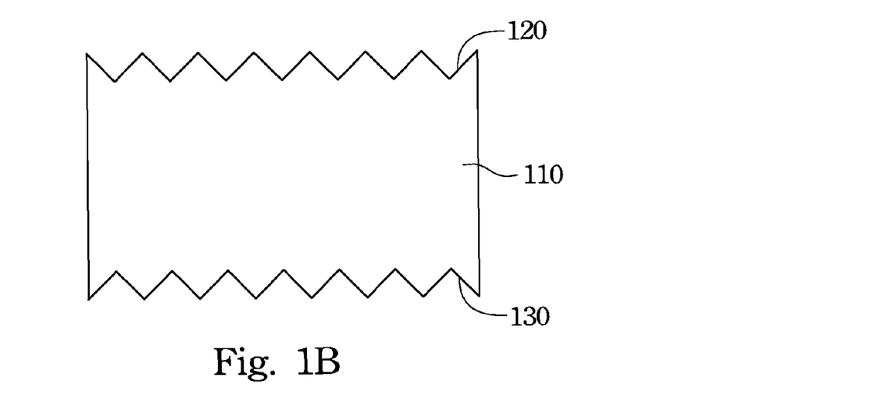
Figure 2:
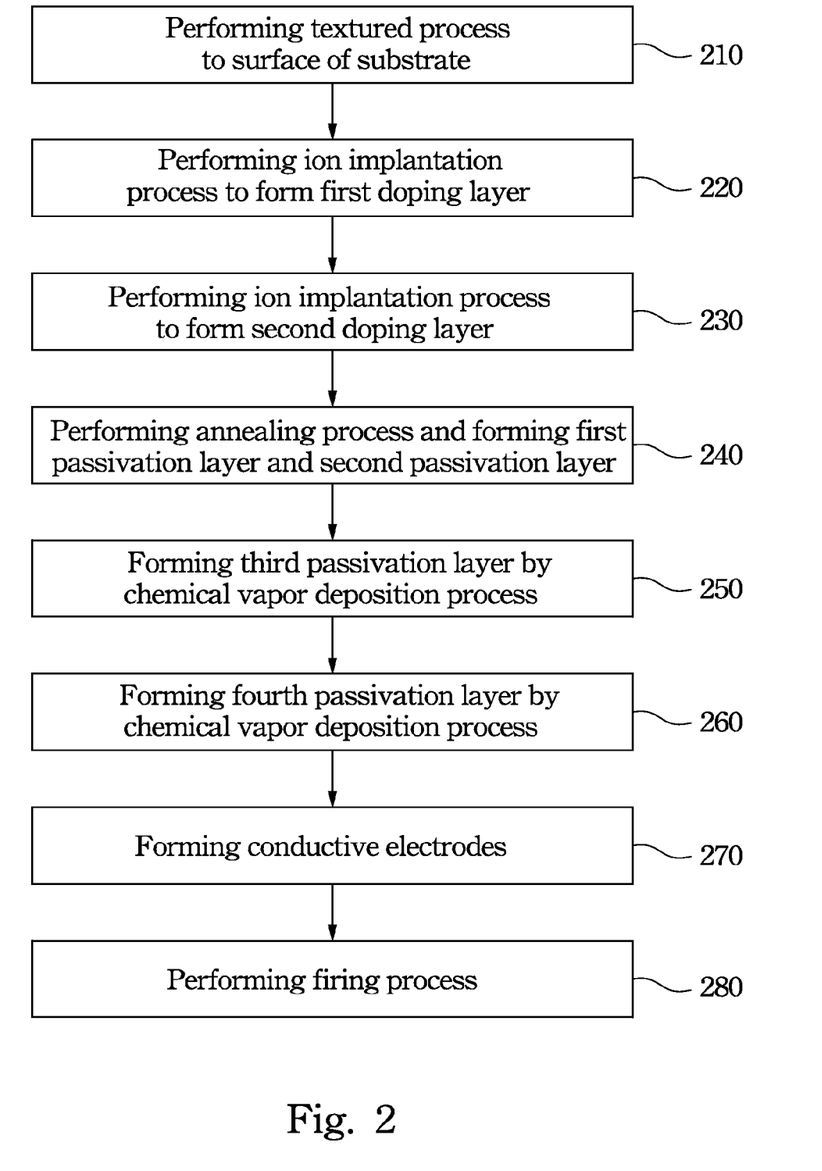
FIG. 2 is a flow diagram of a method of manufacturing a solar cell according to one embodiment of the present disclosure.

At step 210, an etching method is adopted in a textured process, and the textured process is performed to a first surface 120 and a second surface 130 of a substrate 110 in FIG. 1A to form a structure as shown in FIG. 1B. The textured process can be performed to the first surface 120 and the second surface 130, simultaneously or respectively. In practice, the textured process can be performed to the first surface 120 or the second surface 130 only. After the textured process, the incident light can be scattered and multi-reflected when the incident light is passing through the textured surface of the substrate 110 for providing a longer propagation path of the incident light, in order to increase the number of photons entering into the substrate 110 to generate more electron-hole pairs. The foregoing etching method of the textured process can be a wet etching method or a dry etching method.

Figure 1C:
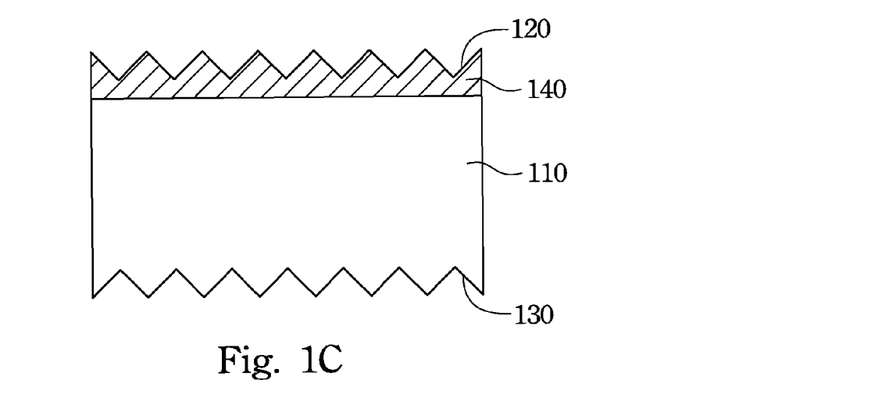

At step 220, an ion implantation process is performed to the first surface 120 of the substrate 110 to form a first doping layer 140, as shown in FIG. 1O. For example, when the substrate 110 is a p-type substrate, n-type dopants are implanted to the first surface 120 of the substrate 110 by the ion implantation process, such that the n-type first doping layer 140 is formed in a portion close to the first surface 120 of the substrate 110, therefore a p-n junction is formed between the substrate 110 and the first doping layer 140. Similarly, when the substrate is an n-type substrate, p-type dopants are implanted to the first surface 120 of the substrate 110 by the ion implantation process, such that the p-type doping layer 140 is formed in the portion close to the first surface 120 of the substrate 110, therefore the p-n junction is formed between the substrate 110 and the first doping layer 140.

Figure 1D:
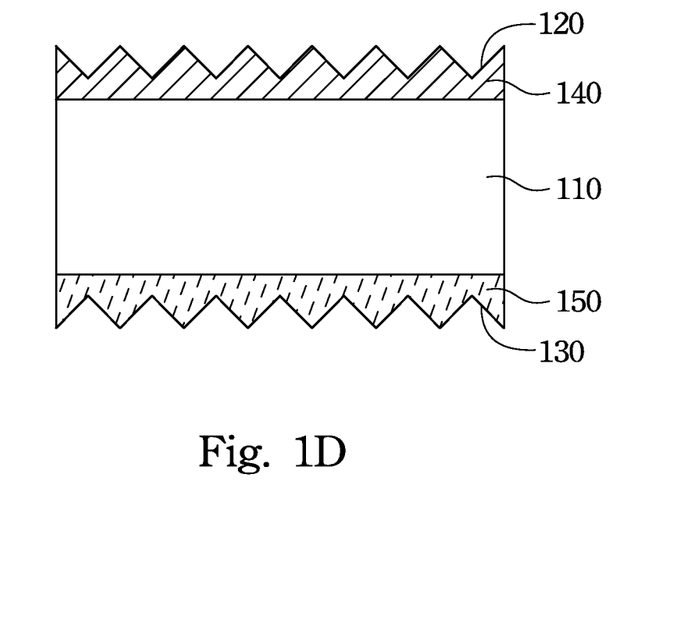

At step 230, the ion implantation process is performed to the second surface 130 of the substrate 110 to form a second doping layer 150, as shown in FIG. 1D. For example, when the substrate 110 is the p-type substrate, $p^+$-type dopants are implanted to the second surface 130 of the substrate 110 by the ion implantation process, such that the $p^+$-type second doping layer 150 is formed in a portion close to the second surface 130 of the substrate 110, therefore a p-p+ junction being symmetric to the p-n junction in step 220 is formed between the substrate 110 and the second doping layer 150. Similarly, when the substrate 110 is the n-type substrate, $n^+$-type dopants are implanted to the second surface 130 of the substrate 110 by the ion implantation process, the $n^+$-type second doping layer 150 is formed in the portion close to the second surface 130 of the substrate 110, therefore a n-n+ junction being symmetric to the p-n junction in step 220 is formed between the substrate 110 and the second doping layer 150.

Figure 1E:
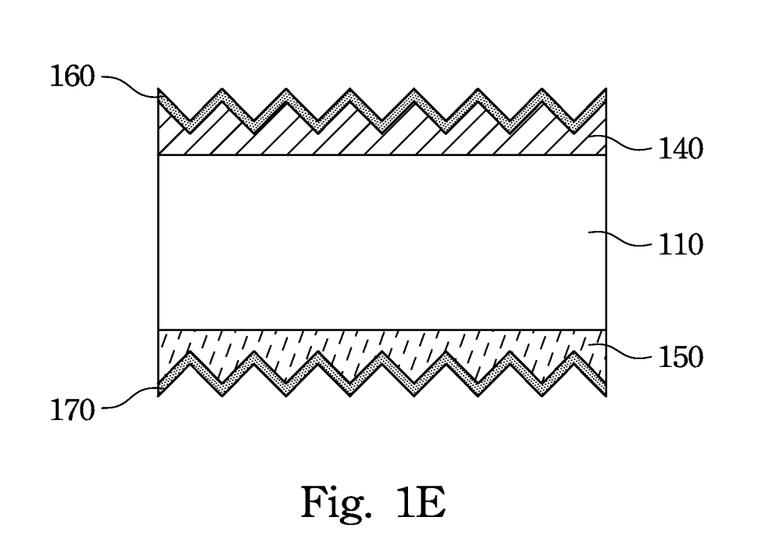

Next, at step 240, an annealing process is performed to a structure formed by the substrate 110, the first doping layer 140 and the second doping layer 150. A traditional furnace annealing method or a rapid thermal annealing method can be adopted in the annealing process. The above-mentioned of the annealing process activates implanted ions and recovers the implantation damages (e.g. lattice disorder) caused by the ion implantation process. After the annealing process is performed to the structure formed by the substrate 110, the first doping layer 140 and the second doping layer 150, the implanted ions can be activated and the implantation damages can be recovered to achieve the purpose of doping the substrate 110. Simultaneously, a first passivation layer 160 is formed on the first doping layer 140 and a second passivation layer 170 is formed on the second doping layer 150 by the annealing process, as shown in FIG. 1E. The above-mentioned of the first passivation layer 160 and the second passivation layer 170 are oxide layers formed on the first doping layer 140 and the second doping layer 150, respectively, after the annealing process.

Figure 1F:
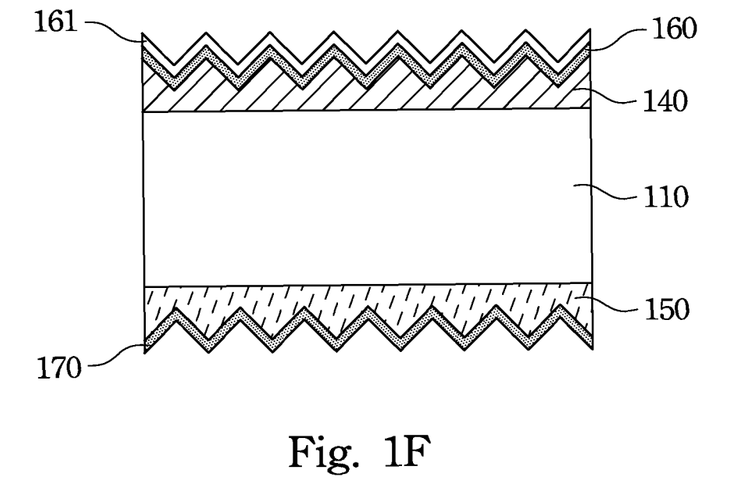

Please refer to FIG. 1F. At step 250, a third passivation layer 161 is formed on the first passivation layer 160 after the annealing process, such that a double-passivation structure is formed by the first passivation layer 160 and the third passivation layer 161. The above-mentioned of the third passivation layer 161 can be formed by a chemical vapor deposition process (e.g. a plasma-enhanced chemical vapor deposition process), wherein the material of the third passivation layer 161 can be nitride or oxide. The above-mentioned of the passivation layers are formed to reduce a reflection of the incident light entering from outside environment into the first doping layer 140 for increasing a photoelectric conversion rate of the solar cell.

Figure 1G:
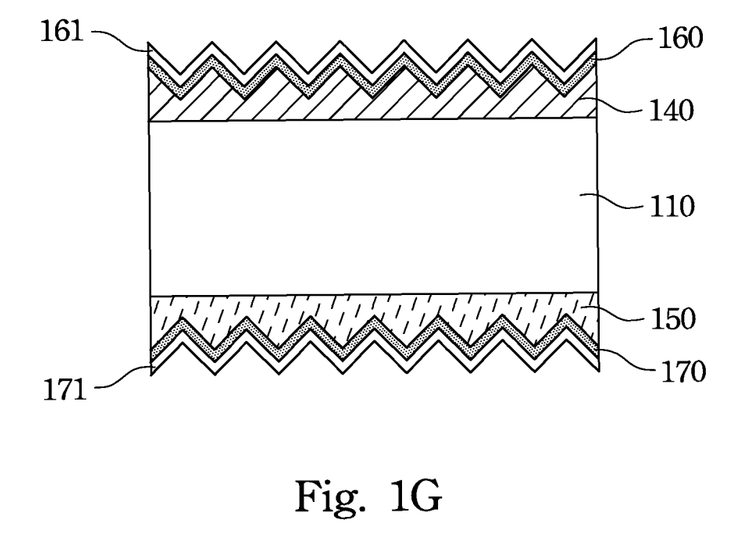

Please refer to FIG. 1G. At step 260, a fourth passivation layer 171 is formed on the second passivation layer 170 after the annealing process, such that a double-passivation structure is formed by the second passivation layer 170 and the fourth passivation layer 171. The fourth passivation layer 171 is formed by the same or similar method as the third passivation layer 161. The previous mentioned of passivation layers are formed to reduce a reflection of the incident light entered from outside environment to the second doping layer 150 for increasing the photoelectric conversion rate of the solar cell.

Figure 1H:
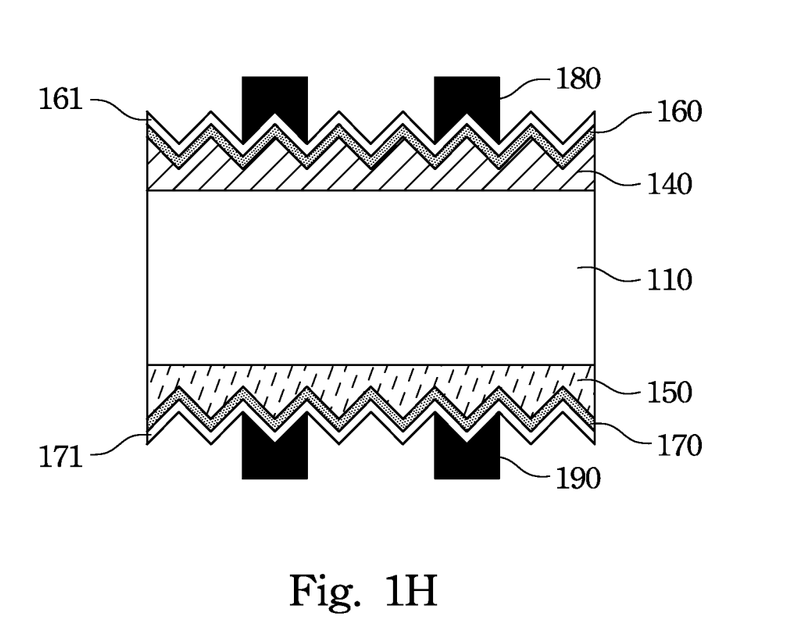

At step 270, conductive electrodes are formed on the third passivation layer 161 and the fourth passivation layer 171, respectively, please refer to FIG. 1H. The conductive electrodes can be formed by a screen-printing method or a plating method. The screen-printing method is used for a specific explication in this embodiment, wherein a metal paste (e.g. silver paste) is adopted in screen-printing method that the metal paste is printed on the third passivation layer 161 by a screen-printing plate or a metal plate having printing patterns. Then, a baking process is performed to harden the metal paste to form a first electrode 180. Next, the metal paste is printed on the fourth passivation layer 171 by the same method, and the baking process is performed to harden the metal paste to form a second electrode 190, such that the printing process of the first electrode 180 and the second electrode 190 is finished. It is noticeable that the printing steps of the first electrode 180 and the second electrode 190 are changeable and are not intended to limit the scope of the present disclosure.

Figure 1I:
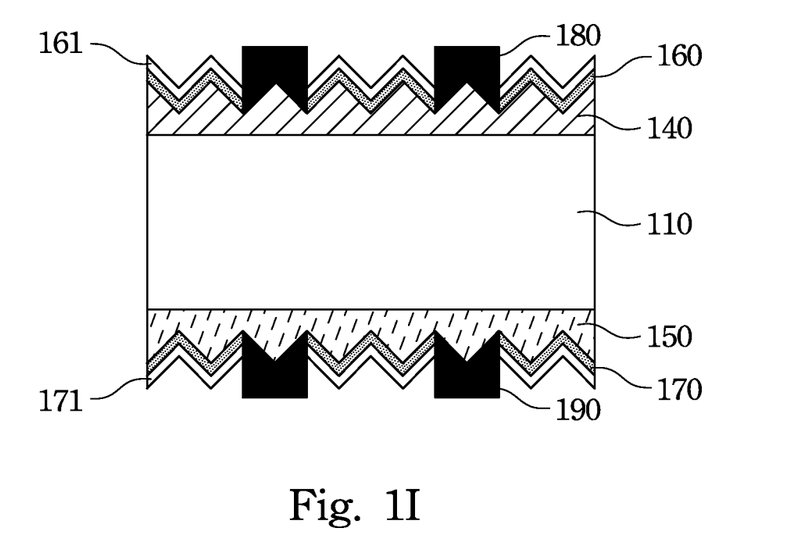

Step 280 continues the previous manufacturing process of the first electrode 180 and the second electrode 190, as shown in FIG. 1I. A high temperature firing process is performed to remove organic vehicle of the metal paste and to let the first electrode 180 pass through the third passivation layer 161 and the first passivation layer 160, so that the first electrode 180 is contacted with the first doping layer 140 to form an ohmic contact. At the same time, the second electrode 190 passes through the fourth passivation layer 171 and the second passivation layer 170, and then the second electrode 190 is contacted with the second doping layer 150 to form the ohmic contact. As a result, the first electrode 180 and the second electrode 190 can conduct the current generated by the electron-hole pairs, and the manufacturing process of a bi-facial solar sell is finished accordingly. Therefore, the solar cell in the present disclosure has double-passivation structure on both sides without increasing the manufacturing process.

FIGS. 3A-3H are structure diagrams of manufacturing process flow of a solar cell according to another embodiment of the present disclosure. FIG. 4 is a flow diagram of a method of manufacturing the solar cell according to another embodiment of the present disclosure. Please refer to FIGS. 3A-3H and FIG. 4 at the same time.

Figure 3A:
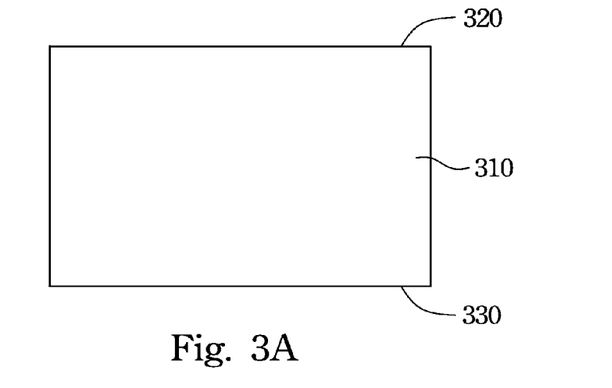
FIGS. 3A-3H are structure diagrams of manufacturing process flow of a solar cell according to another embodiment of the present disclosure.
Figure 3B:
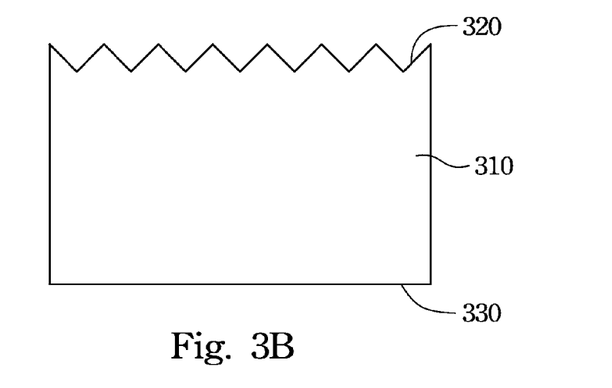
Figure 4:
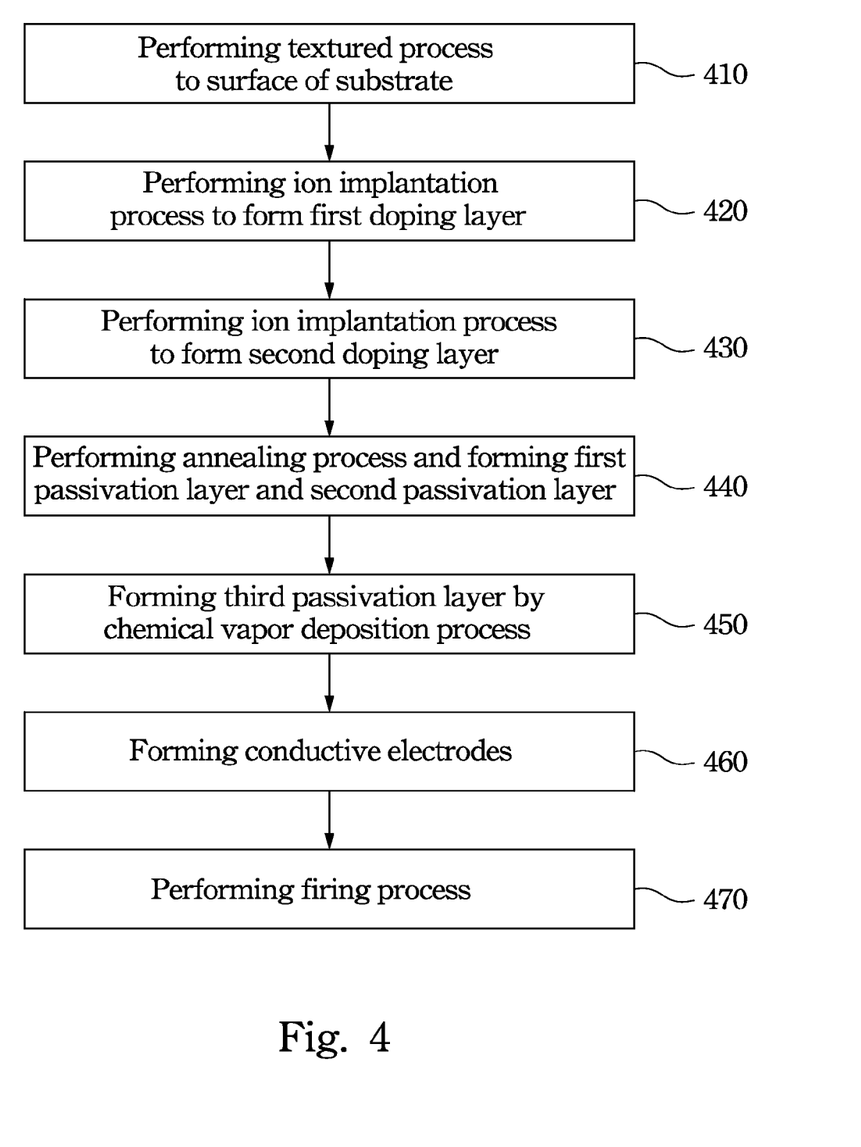
FIG. 4 is a flow diagram of a method of manufacturing a solar cell according to another embodiment of the present disclosure.

At step 410, an etching process is adopted in a textured process, and the textured process is performed to a first surface 320 of a substrate 310 in FIG. 3A to form a structure as shown in FIG. 3B. In practice, the textured process can be performed to the first surface 320 and (or) the second surface 330 of the solar cell, simultaneously or respectively and is not intended to limit the scope of the present disclosure. After the textured process, the incident light can be scattered and multi-reflected when the incident light is passing through the textured surface of the substrate 310 for providing a longer propagation path of the incident light, in order to increase the number of photons entering into the substrate 310 to generate more electron-hole pairs. The foregoing etching method of the textured process can be a wet etching method or a dry etching method.

Figure 3C:
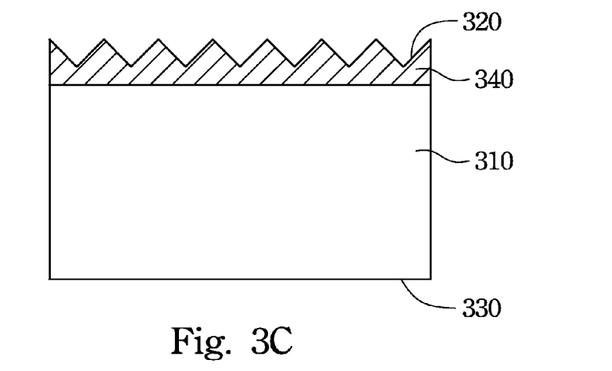

At step 420, an ion implantation process is performed to the first surface 320 of the substrate 310 to form a first doping layer 340, as shown in FIG. 3C. For example, when the substrate 310 is a p-type substrate, n-type dopants are implanted to the first surface 320 of the substrate 310 by the ion implantation process, such that the n-type first doping layer 340 is formed in a portion close to the first surface 320 of the substrate 310, therefore a p-n junction is formed between the substrate 310 and the first doping layer 340. Similarly, when the substrate is an n-type substrate, p-type dopants are implanted to the first surface 320 of the substrate 310 by the ion implantation process, such that the p-type doping layer 340 is formed in the portion close to the first surface 320 of the substrate 310, therefore the p-n junction is formed between the substrate 310 and the first doping layer 340.

Figure 3D:
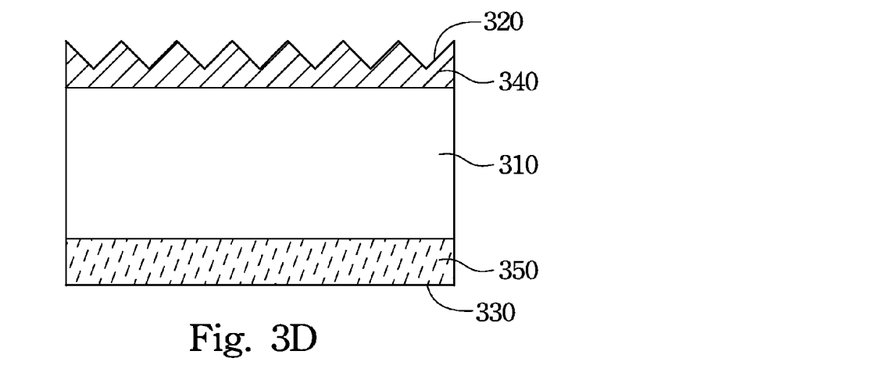

At step 430, the ion implantation process is performed to the second surface 330 of the substrate 310 to form a second doping layer 350, as shown in FIG. 3D. For example, when the substrate 310 is the p-type substrate, $p^+$-type dopants are implanted to the second surface 330 of the substrate 310 by the ion implantation process, such that the $p^+$-type second doping layer 350 is formed in a portion close to the second surface 330 of the substrate 310, therefore a p-p+ junction being symmetric to the p-n junction in step 420 is formed between the substrate 310 and the second doping layer 350. Similarly, when the substrate 310 is the n-type substrate, $n^+$-type dopants are implanted to the second surface 330 of the substrate 310 by the ion implantation process, the $n^+$-type second doping layer 350 is formed in the portion close to the second surface 330 of the substrate 310, therefore a n-n+ junction being symmetric to the p-n junction in step 420 is formed between the substrate 310 and the second doping layer 350.

Figure 3E:
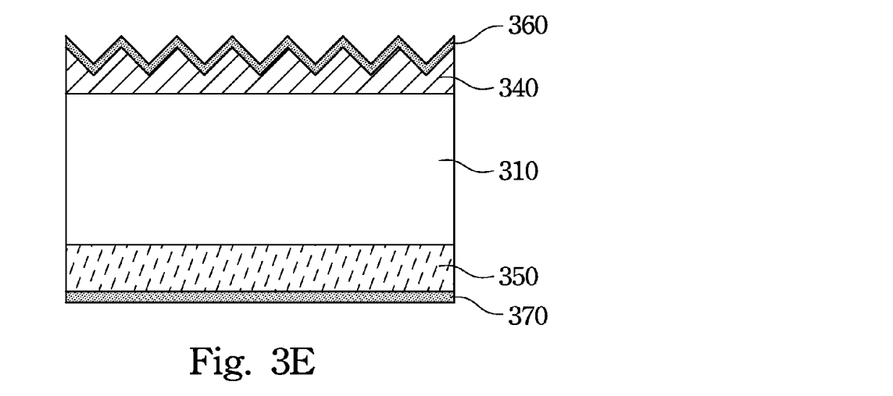

Next, at step 440, an annealing process is performed to a structure formed by the substrate 310, the first doping layer 340 and the second doping layer 350. A traditional furnace annealing method or a rapid thermal annealing method can be adopted in the annealing process. The above-mentioned of the annealing process activates implanted ions and recovers the implantation damages caused by the ion implantation process. After the annealing process is performed to the structure formed by the substrate 310, the first doping layer 340 and the second doping layer 350, the implanted ions can be activated and the implantation damages can be recovered to achieve the purpose of doping the substrate 310. Simultaneously, a first passivation layer 360 is formed on the first doping layer 340 and a second passivation layer 370 is formed on the second doping layer 350 by the annealing process, as shown in FIG. 3E. The above-mentioned of the first passivation layer 360 and the second passivation layer 370 are oxide layers formed on the first doping layer 340 and the second doping layer 350 after the annealing process.

Figure 3F:
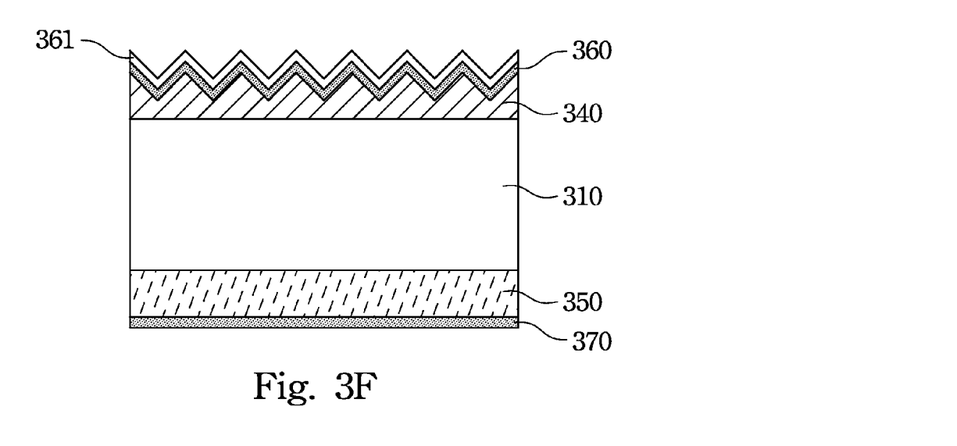

Please refer to FIG. 3F. At step 450, a third passivation layer 361 is formed on the first passivation layer 360 after the annealing process, such that a double-passivation structure is formed by the first passivation layer 360 and the third passivation layer 361. The above-mentioned of the third passivation layer 361 can be formed by a chemical vapor deposition process (e.g. a plasma-enhanced chemical vapor deposition process), wherein the material of the third passivation layer 361 can be nitride or oxide. The above-mentioned of the passivation layers are formed to reduce a reflection of the incident light entering from outside environment into the first doping layer 340 for increasing a photoelectric conversion rate of the solar cell.

Figure 3G:
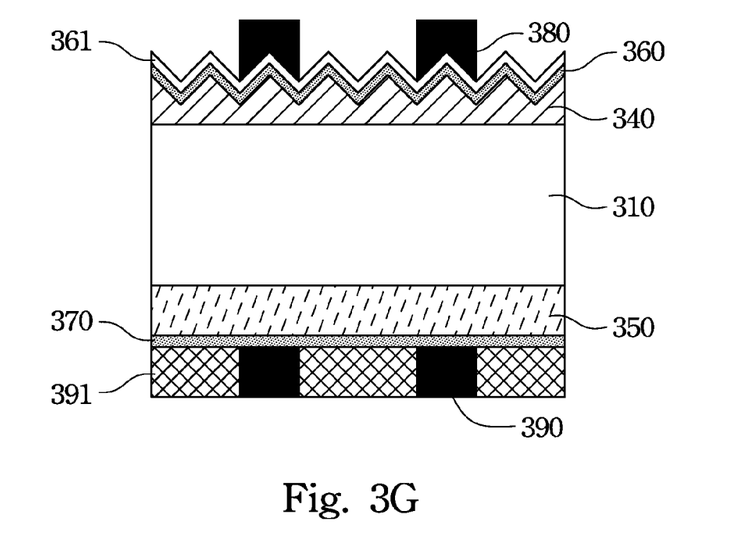

At step 460, conductive electrodes are respectively formed on the third passivation layer 361 and the second passivation layer 370 after the annealing process, as shown in FIG. 3G. The conductive electrodes can be formed by a screen-printing method or a plating method. The screen printing method is used for a specific explication in this embodiment, wherein a metal paste (e.g. silver paste) is adopted in screen-printing method that the metal paste is printed on the third passivation layer 361 by a screen-printing plate or a metal plate having printing patterns. Then a baking process is performed to harden the metal paste to form a first electrode 380. Next, the metal paste is printed on the second passivation layer 370 by the same method, and the baking process is performed to harden the metal paste to form a second electrode 390. Then, another metal paste (e.g. copper paste) material is adopted for spreading on the second passivation layer 370. After that, the baking process is performed to harden the metal paste to form a back surface layer 391, and the printing process of the first electrode 380 and the second electrode 390 is finished accordingly. It is noticeable that the printing steps of the first electrode 380 and the second electrode 390 are changeable and are not intended to limit the scope of the present disclosure.

Figure 3H:
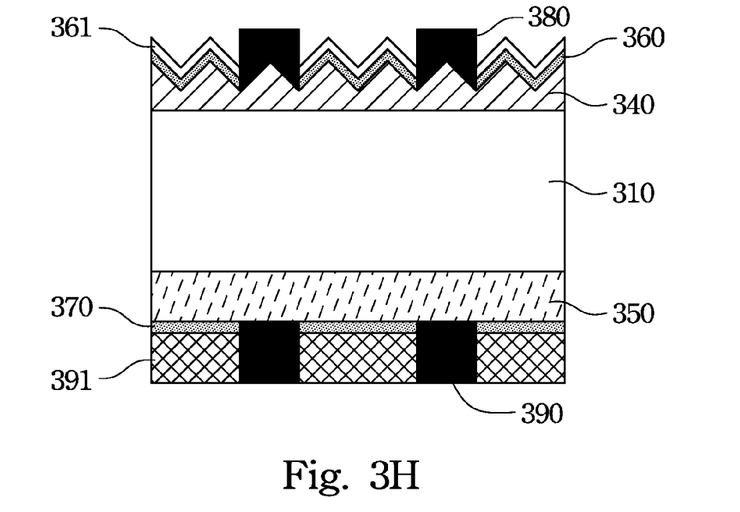

Step 470 continues the previous manufacturing process of the first electrode 380 and the second electrode 390, as shown in FIG. 3H. A high temperature firing process is performed to remove organic vehicle of the metal paste and to let the first electrode 380 pass through the third passivation layer 361 and the first passivation layer 360, so that the first electrode 380 is contacted with the first doping layer 340 to form an ohmic contact. At the same time, the second electrode 390 passes through the second passivation layer 370, and then the second electrode 390 is contacted with the second doping layer 350 to form the ohmic contact. As a result, the first electrode 380 and the second electrode 390 can conduct the current generated by the electron-hole pairs, and the manufacturing process of the solar sell is finished accordingly. Therefore, the solar cell in the present disclosure has a double-passivation structure without increasing the manufacturing process.

The foregoing manufacturing steps and drawings of the embodiments were chosen and described in order to explain the principles of the disclosure and their practical application without detailed descriptions of the whole manufacturing process of the solar cell. The foregoing steps of the present disclosure could be adjusted to fit the practical application without departing from its spirit and scope.

In sum, the present disclosure has the advantage of simplifying the manufacturing process of the solar cell. In the present disclosure, the ion implantation process is adopted to dope the dopants, and after the annealing process is performed to activate the implanted dopants, the doping process of the substrate of the solar cell is finished. The foregoing ion implantation process can be adopted, for example, to omit the cleaning process to remove the phosphosilicate glass and to omit the edge isolation process of the substrate, in order to simplify the doping process of the solar cell. The passivation layers can be formed by performing the anneal process after the ion implantation process and by performing the chemical vapor deposition process to form the double-passivation layers within less manufacturing steps to simplify the manufacturing process and to increase the production speed of the solar cell.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method of manufacturing a solar cell, comprising:
    performing an ion implantation process to a first surface of a substrate to form a first doping layer;
    performing the ion implantation process to a second surface of the substrate to form a second doping layer, wherein the first surface is opposite to the second surface;
    performing an annealing process to the structure formed by the substrate, the first doping layer and the second doping layer, and forming a first passivation layer on the first doping layer and a second passivation layer on the second doping layer by the annealing process;
    forming a third passivation layer on the first passivation layer formed after the annealing process is performed, wherein the third passivation layer is formed by a chemical vapor deposition process;
    forming a fourth passivation layer on the second passivation layer formed after the annealing process is performed wherein the fourth passivation layer is formed by a chemical vapor deposition process; and
    forming a first conductive electrode on the third passivation layer and a second conductive electrode on the fourth passivation layer,
    wherein the first conductive electrode passes through the third passivation layer and the first passivation layer to contact with the first doping layer, and the second conductive electrode passes through the fourth passivation layer and the second passivation layer to contact with the second doping layer.

2. The method of manufacturing a solar cell of claim 1, further comprising:
    performing a texture process to the first surface and the second surface of the substrate by an etching method before the ion implantation process.

3. The method of manufacturing a solar cell of claim 1, wherein the substrate is a p-type substrate, n-type dopants are implanted to the first surface by the ion implantation process, $p^+$-type dopants are implanted to the second surface by the ion implantation process.

4. The method of manufacturing a solar cell of claim 1, wherein the substrate is an n-type substrate, p-type dopants are implanted to the first surface by the ion implantation process, $n^+$-type dopants are implanted to the second surface by the ion implantation process.

5. A method of manufacturing a solar cell, comprising:
    performing an ion implantation process to a first surface of a substrate to form a first doping layer;
    performing the ion implantation process to a second surface of the substrate to form a second doping layer, wherein the first surface is opposite to the second surface;
    performing an annealing process to the structure formed by the substrate, the first doping layer and the second doping layer, and forming a first passivation layer on the first doping layer and a second passivation layer on the second doping layer by the annealing process;
    forming a third passivation layer on the first passivation layer formed after the annealing process is performed, wherein the third passivation layer is formed by a chemical vapor deposition process; and
    forming a first conductive electrode on the third passivation layer and a second conductive electrode on the second passivation layer formed after the annealing process is performed,
    wherein the first conductive electrode passes through the third passivation layer and the first passivation layer to contact with the first doping layer, and the second conductive electrode passes through the second passivation layer to contact with the second doping layer.

6. The method of manufacturing a solar cell of claim 5, further comprising:
    performing a texture process to the first surface of the substrate by an etching method before the ion implantation process.

7. The method of manufacturing a solar cell of claim 5, wherein the substrate is a p-type substrate, n-type dopants are implanted to the first surface by the ion implantation process, $p^+$-type dopants are implanted to the second surface by the ion implantation process.

8. The method of manufacturing a solar cell of claim 5, wherein the substrate is an n-type substrate, p-type dopants are implanted to the first surface by the ion implantation process, $n^+$-type dopants are implanted to the second surface by the ion implantation process.

* * * * *